US009093406B2

(12) United States Patent
Kim

(10) Patent No.: US 9,093,406 B2
(45) Date of Patent: Jul. 28, 2015

(54) ORGANIC LIGHT EMITTING DISPLAY DEVICE

(75) Inventor: Jungbae Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 335 days.

(21) Appl. No.: 13/539,265

(22) Filed: Jun. 29, 2012

(65) Prior Publication Data
US 2013/0176195 A1 Jul. 11, 2013

(30) Foreign Application Priority Data

Jan. 6, 2012 (KR) .................. 10-2012-0002066

(51) Int. Cl.
H01L 27/32 (2006.01)
H01L 27/12 (2006.01)
H01L 27/15 (2006.01)

(52) U.S. Cl.
CPC ........ *H01L 27/3262* (2013.01); *H01L 27/1255* (2013.01); *H01L 27/3265* (2013.01)

(58) Field of Classification Search
CPC ............ H01L 23/52–23/5225; H01L 27/1214; H01L 27/127; H01L 27/3262; H01L 27/3265
USPC ................................................. 313/498–512
See application file for complete search history.

(56) References Cited

U.S. PATENT DOCUMENTS

2006/0076618 A1* 4/2006 Kang .............................. 257/336
2007/0090345 A1* 4/2007 Wu et al. ......................... 257/40
2008/0265254 A1* 10/2008 Nishiura ......................... 257/59

FOREIGN PATENT DOCUMENTS

JP 2009-200336 A 9/2009
KR 10-1065412 9/2011
KR 10-1073272 10/2011

OTHER PUBLICATIONS

Korean Patent Abstracts, Publication No. 10-2011-0037408A, dated Apr. 13, 2011, for corresponding Korean Patent 10-1065412, 1 page.
Korean Patent Abstracts, Publication No. 10-2011-0049125A, dated May 12, 2011, for corresponding Korean Patent 10-1073272, 1 page.

* cited by examiner

*Primary Examiner* — Karabi Guharay
*Assistant Examiner* — Nathaniel Lee
(74) *Attorney, Agent, or Firm* — Christie, Parker & Hale, LLP

(57) ABSTRACT

An organic light emitting diode display device is provided. The organic light emitting display device includes at least one capacitor, at least one transistor, and an organic light emitting element connected to the capacitor and the transistor. The transistor includes a first structure and a second structure disposed on the first structure with a first insulating layer therebetween. The capacitor includes a first electrode and a second electrode disposed on the first electrode with the insulating layer therebetween. A distance between the first electrode and the second electrode in at least a region, is less than a distance between the first structure and the second structure.

31 Claims, 14 Drawing Sheets

ORGANIC LIGHT EMITTING DISPLAY DEVICE

CROSS-REFERENCE TO RELATED APPLICATION

This application claims priority to and the benefit of Korean Patent Application No. 10-2012-0002066, filed on Jan. 6, 2012, in the Korean Intellectual Property Office, the disclosure of which is incorporated herein in its entirety by reference.

BACKGROUND

1. Field

The following description relates to organic light emitting diode display devices, and more particularly, to organic light emitting diode display devices capable of increasing aperture ratio and reducing error rate.

2. Description of Related Art

An organic light emitting display device includes an organic light emitting element disposed in each of pixels. The organic light emitting element includes an organic light emitting layer for emitting light and electrodes for applying a driving voltage to the organic light emitting layer.

Additionally, each of the pixels includes a switching transistor, a driving transistor, and a capacitor. The switching transistor outputs a data signal in response to a gate signal. The driving transistor provides the driving voltage to the organic light emitting element. The capacitor maintains the driving voltage applied to the organic light emitting element for one frame duration.

The pixel has a multi-layered structure for the formation of the transistors and the capacitor. The capacitor having a set or predetermined capacitance occupies a set or predetermined area in the pixel. Since the property (e.g. dielectric constant) of an insulating layer used as the dielectric of the capacitor has a set value, it may be difficult to form the capacitor having a desired capacitance in a limited area. Also, if an area of the capacitor increases, an area of the organic light emitting element is reduced, so that aperture ratio is reduced.

SUMMARY

Aspects of embodiments of the present invention are directed toward organic light emitting diode display devices including capacitors capable of increasing capacitance and reducing a leakage current.

According to an embodiment of the present invention, an organic light emitting display device includes a substrate with at least one pixel and at least one driving line providing a driving voltage to the pixel.

The pixel includes a switching transistor outputting a data signal in response to a gate signal, a capacitor connected to the switching transistor, a driving transistor connected to the capacitor and the driving line, and an organic light emitting element connected to the driving transistor.

In one embodiment, the switching transistor includes a first structure and a second structure disposed on the first structure with a first insulating layer therebetween. The capacitor includes a first electrode and a second electrode disposed on the first electrode with the first insulating layer therebetween. The second electrode is connected to the driving line. A distance between the first electrode and the second electrode in at least a region, is less than a distance between the first structure and the second structure.

In one embodiment, the first structure is a gate electrode, and the second structure includes a semiconductor layer, a source electrode of which at least a portion is overlapped with the semiconductor layer, and a drain electrode of which at least a portion is overlapped with the semiconductor layer. The drain electrode is spaced apart from the source electrode.

In one embodiment, the first structure is disposed under the first insulating layer, and the second structure is disposed on the first insulating layer. The first electrode is disposed under the first insulating layer, and the second electrode is disposed on the first insulating layer. The first insulating layer has a first concave region corresponding to a region in which the first electrode is formed when viewed from a plan view. At least a portion of the second electrode is disposed in the first concave region.

In some embodiments, the display device includes a second insulating layer covering the second structure and the second electrode. The capacitor further includes a third electrode facing the second electrode with the second insulating layer therebetween. The third electrode is electrically connected to the first electrode.

In other embodiments, the semiconductor layer of the switching transistor is disposed on a different plane from a plane on which the source electrode and the drain electrode of the switching transistor are disposed. The first insulating layer is disposed between the semiconductor layer and the gate electrode. The source electrode and the drain electrode are disposed on the gate electrode with a second insulating layer therebetween. Each of the source electrode and the drain electrode is connected to the semiconductor layer.

The first electrode may be formed of the same material as the semiconductor layer, and the second electrode may be formed of the same material as the gate electrode. Here, the semiconductor layer and the first electrode are disposed on the same plane.

According to still other embodiments of the present invention, a display device includes a substrate with at least one pixel, and at least one driving line providing a driving voltage to the pixel.

The pixel includes a switching transistor and a capacitor. The capacitor includes a first electrode connected to the drain electrode of the switching transistor, a second electrode disposed on the first electrode with the first insulating layer therebetween and connected to the driving line, and a third electrode facing the second electrode with the second insulating layer therebetween and electrically connected to the first electrode.

In one embodiment, the second insulating layer has a concave region corresponding to a region in which the second electrode is formed when viewed from a plan view. At least a portion of the third electrode is disposed in the concave region.

According to yet other embodiments of the present invention, a display device includes a substrate including a transistor region and a capacitor region; a first conductive layer, a first insulating layer, and a second conductive layer sequentially stacked on the substrate; and a semiconductor layer disposed in the transistor region.

In one embodiment, the first insulating layer includes a first insulating part, and a second insulating part of which thicknesses are different from each other. The first insulating part is disposed between the semiconductor layer and the first conductive layer of the transistor region, or between the semiconductor layer and the second conductive layer of the transistor region. The second insulating part is disposed between the first conductive layer of the capacitor region and the second conductive layer of the capacitor region.

According to yet still other embodiments of the present invention, a display device includes a substrate including a transistor region and a capacitor region; and a semiconductor layer, a first insulating layer, a first conductive layer, a second insulating layer, and a second conductive layer sequentially stacked on the substrate.

In one embodiment, the first insulating layer includes a first insulating part and a second insulating part of which thicknesses are different from each other. The first insulating part is disposed between the semiconductor layer of the transistor region and the first conductive layer of the transistor region. The second insulating part is disposed between the semiconductor layer of the capacitor region and the first conductive layer of the capacitor region.

BRIEF DESCRIPTION OF THE DRAWINGS

The present invention will become more apparent in view of the attached drawings and accompanying detailed description.

DETAILED DESCRIPTION

Figure 1:
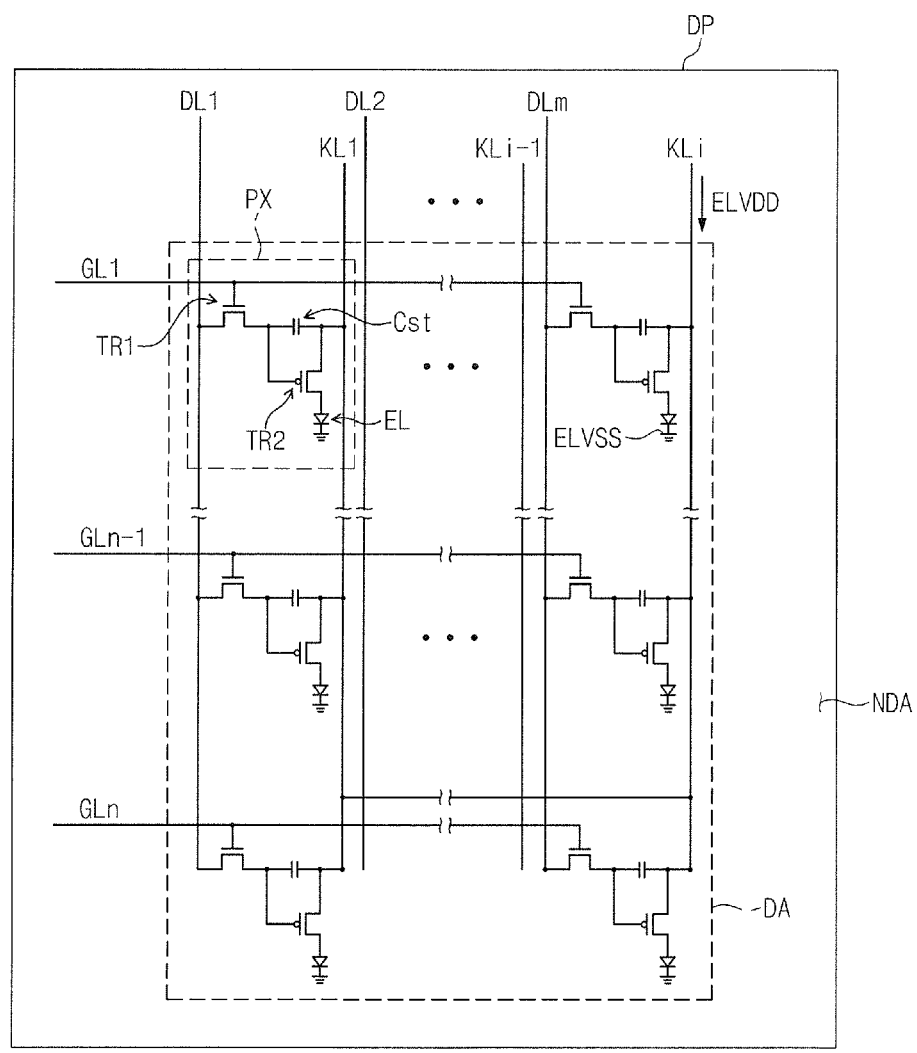
FIG. 1 is a circuit diagram of an organic light emitting display device according to an embodiment of the present invention.

Hereinafter, an organic light emitting display device according to an embodiment of the present invention will be described with reference to the drawings.

In the drawings, it will be understood that when an element such as a layer, region or substrate is referred to as being "on" another element, it can be directly on the other element, or one or more intervening elements may be present therebetween. Moreover, exemplary embodiments are described herein with reference to cross-sectional illustrations and/or plan illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein, but are to include deviations in shapes that result, for example, from manufacturing. For example, an etching region illustrated as a rectangle, will typically have rounded or curved features. Thus, the regions illustrated in the figures are schematic in nature and their shapes are not intended to illustrate the actual shape of a region of a device and are not intended to limit the scope of example embodiments.

Figure 2:
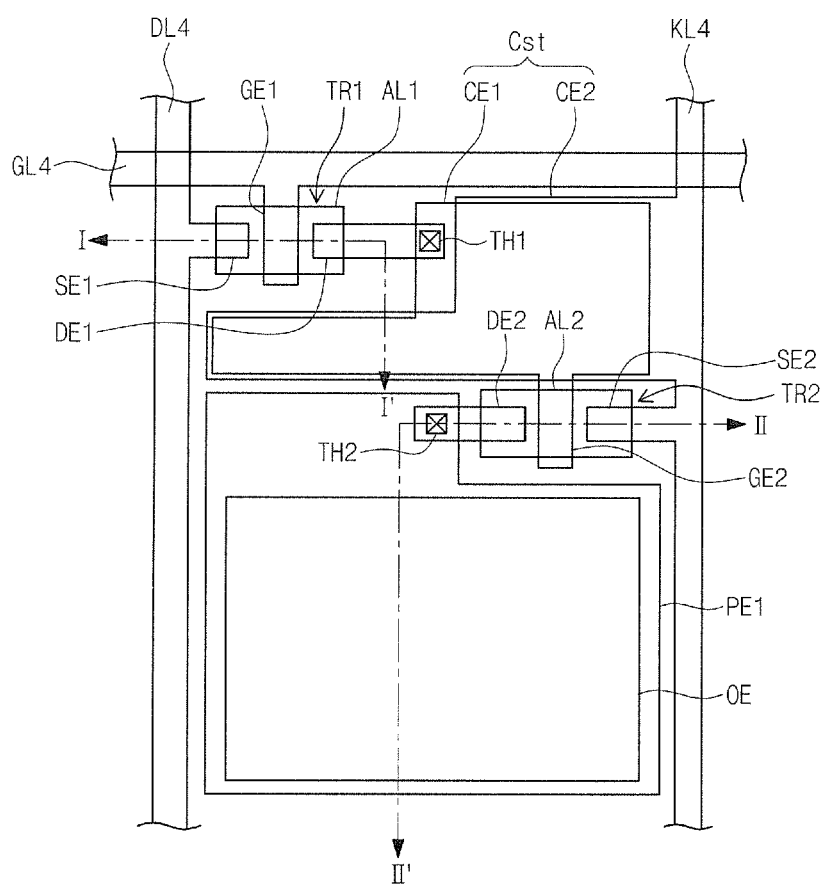
FIG. 2 is a plan view of a pixel illustrated in FIG. 1.
Figure 3A:
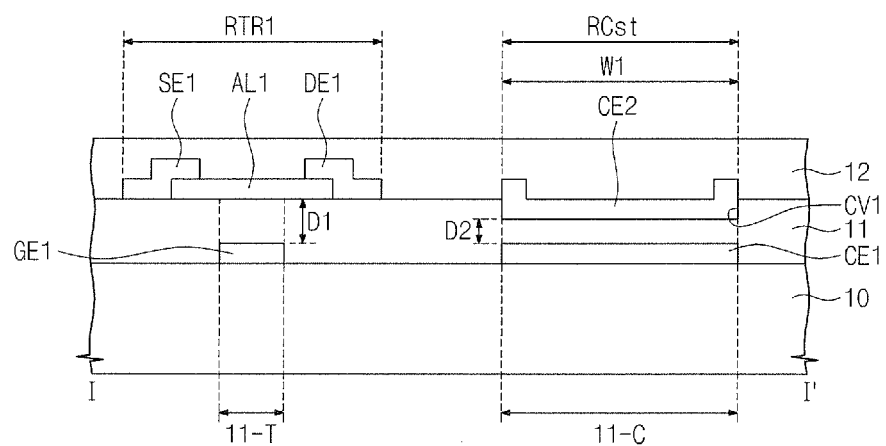
FIGS. 3A and 3B are cross-sectional views illustrating portions of a pixel illustrated in FIG. 2.
Figure 3B:
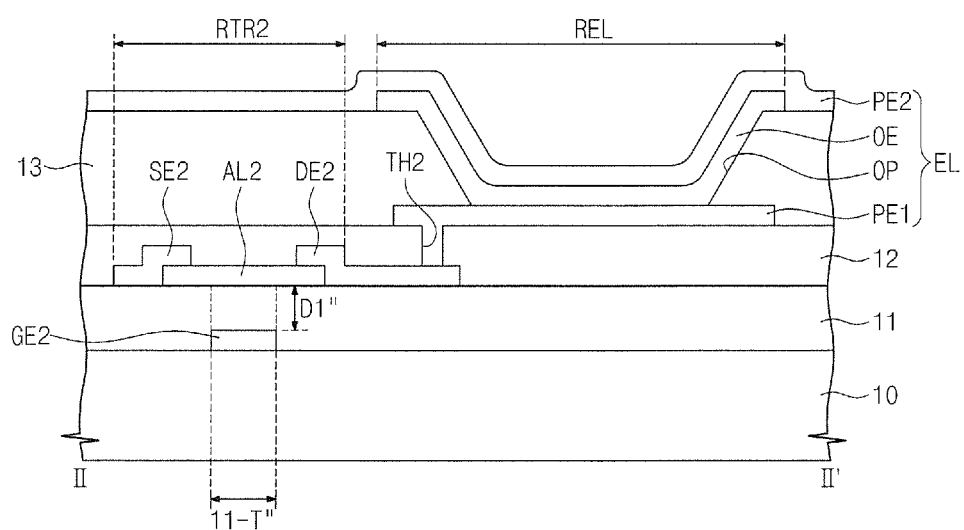

FIG. 1 is a circuit diagram of an organic light emitting display device according to an embodiment of the present invention. FIG. 2 is a plan view of a pixel illustrated in FIG. 1. FIGS. 3A and 3B are cross-sectional views illustrating portions of a pixel illustrated in FIG. 2. An organic light emitting display device (hereinafter, referred to as "a display device") according to an embodiment of the present invention, will be described with reference to FIGS. 1 to 3.

As illustrated in FIG. 1, the display device includes a display panel DP having at least one pixel PX. The pixel PX may be provided in plural and the plurality of pixels PX may be arranged in matrix form.

The display panel DP may be divided into a display region DA in which the pixels PX are disposed and a non-display region NDA adjacent to the display region DA. A gate driver or a data driver may be mounted on the non-display region NDA. Alternatively, a flexible circuit board receiving a gate signal and a data voltage from the outside may be connected to the non-display region NDA.

The display panel DP includes at least one substrate 10 illustrated in FIGS. 3A and 3B and a plurality of signal lines disposed on the substrate 10. The signal lines may include a plurality of gate lines GL1 to GLn, a plurality of data lines DL1 to DLm, and a plurality of driving lines KL1 to KLi. Each of the gate lines GL1 to GLn receives the gate signal from the gate driver, and each of the data lines DL1 to DLm receives the data voltage from the data driver. Each of the driving lines KL1 to KLi receives a driving voltage.

The pixel PX includes a switching transistor TR1, a driving transistor TR2, a capacitor Cst, and an organic light emitting element EL.

The switching transistor TR1 is connected to one of the gate lines GL1 to GLn and one of the data lines DL1 to DLm. The switching transistor TR1 outputs the data voltage in response to the gate signal; and the switching transistor TR1 switches the driving transistor TR2 (and is electrically connected to a gate electrode (e.g., GE2) of the driving transistor TR2).

The capacitor Cst is connected to the switching transistor TR1 and one of the driving lines KL1 to KLi. A difference voltage between the data voltage and the driving voltage is charged in the capacitor Cst.

The driving transistor TR2 is connected to the capacitor Cst and one of the driving lines KL1 to KLi. The driving transistor TR2 applies a driving current to the organic light emitting element EL in response to the charges stored in the capacitor Cst. The organic light emitting element EL generates light corresponding to the amount of the current applied from the driving transistor TR2.

The pixel PX may further include a thin film transistor and a capacitor to compensate for a threshold voltage of the driving transistor TR2.

The pixel PX will be described in more detail with reference to FIGS. 2, 3A, and 3B. FIG. 2 shows one gate line GL4 of the gate lines GL1 to GLn, one data line DL4 of the data lines DL1 to DLm, and one driving line KL4 of the driving lines KL1 to KLi. And a second electrode PE2 of the organic light emitting element EL is omitted in FIG. 2.

A gate electrode GE1 of the switching transistor TR1 is protruded from the one gate line GL4. The gate line GL4 is extended in a first direction (e.g. a latitudinal (landscape) direction) on the substrate 10.

A first semiconductor layer AL1, a first source electrode SE1, and a first drain electrode DE1 of the switching transistor TR1 are disposed on the first electrode GE1 with a first insulating layer 11 therebetween. In the present embodiment, the first gate electrode GE1 is defined as one structure. The first semiconductor layer AL1, the source electrode SE1, and the first drain electrode DE1 are defined as another structure.

The one data line DL4 and the one driving line KL4 are disposed on the first insulating layer 11. Each of the one data line DL4 and the one driving line KL4 is extended in a second direction (e.g. a longitudinal direction) crossing the first direction.

The first source electrode SE1 branches off from the data line DL4. At least a portion of the first source electrode SE1 is overlapped with the first semiconductor layer AL1. As illustrated in FIG. 3A, a portion of the first source electrode SE1 may be disposed on the first semiconductor layer AL1 and a remaining portion (e.g., the rest) of the first source electrode SE1 may be disposed on the first insulating layer 11.

The first drain electrode DE1 of the switching transistor TR1 is separated from the first source electrode SE1 on the first insulating layer 11. At least a portion of the first drain electrode DE1 is overlapped with the first semiconductor layer AL1. As illustrated in FIG. 3A, a portion of the first drain electrode DE1 may be in contact with the first semiconductor layer AL1.

A first electrode CE1 of the capacitor Cst is disposed on the substrate 10. The first electrode CE1 is electrically connected to the switching transistor TR1. As illustrated in FIG. 2, the first electrode CE1 may be connected to the first drain electrode DE1 through a first contact hole TH1 penetrating the first insulating layer 11.

A second electrode CE2 of the capacitor Cst is disposed on the first electrode CE1 with the insulating layer 11 therebetween. The second electrode CE2 branches off from the driving line KL4.

The first insulating layer 11 has a concave region CV1 which is disposed to correspond to the first electrode CE1. At least a portion of the second electrode CE2 is disposed in the first concave region CV1 of the first insulating layer 11. A portion of the first insulating layer 11, which is disposed between the first electrode CE1 and the second electrode CE2, corresponds to a dielectric of the capacitor Cst.

A distance D2 between the first electrode CE1 and the second electrode CE2 is shorter than a distance D1 between the first gate electrode GE1 and the first semiconductor layer AL1. In other words, a thickness of the first insulating layer 11 may vary according to a position thereof. However, according to embodiments of the present invention, it may not be required that the distance D2 between the first electrode CE1 and the second electrode CE2 is entirely (positively) uniform.

Widths of the first electrode CE1, the second electrode CE2, and the first concave region CV1 may be equal to each other. In other words, each of the widths of the first and second electrodes CE1 and the CE2 may be equal (identical) to the width W1 of the first concave region CV1. However, the present invention is not limited thereto. In other embodiments, the width of the first electrode CE1 may be greater than the width W1 of the first concave region CV1. Additionally, a portion of the second electrode CE2 may be extended onto one surface (e.g., an upper surface) of the insulating layer 11.

As illustrated in FIG. 3A, the substrate 10 includes a first transistor region RTR1 and a capacitor region RCst. The first transistor region RTR1 is a region in which the switching transistor TR1 is formed. The capacitor region RCst is a region in which the capacitor Cst is formed.

A first conductive layer, a first insulating layer, and a second conductive layer are sequentially stacked on the substrate 10. The first semiconductor layer AL1 disposed in the first transistor region RTR1.

Each of the first conductive layer and the second conductive layer may include a plurality of electrodes. For example, as illustrated in FIG. 3A, the first conductive layer may include the first gate electrode GE1 and the first electrode CE1, and the second conductive layer may include the first source electrode SE1, the first drain electrode DE1, and the second electrode CE2.

Each of the first conductive layer and the second conductive layer may include platinum (Pt) that has a high work function, gold (Au), indium tin oxide (ITO), zinc oxide (ZnO), zinc tin oxide (ZTO), carbon nano tube (CNT), titanium-aluminum alloy (Ti/Al/Ti), and/or molybdenum (Mo). Additionally, each of the first conductive layer and the second conductive layer may have a multi-layered structure formed of the materials described above.

The first semiconductor layer AL1 may be formed of polysilicon semiconductor or oxide semiconductor. The first insulating layer 11 may have an inorganic layer, an organic layer, or a multi-layered structure including at least one of the inorganic layer and the organic layer.

Even though not shown in the drawings, a buffer layer may be disposed on one surface of the substrate 10. The buffer layer may be formed of a material capable of improving a combining force of the substrate 10 and the first conductive layer.

The first insulating layer 11 includes a first insulating part 11-T disposed between the first semiconductor layer AL1 and the first gate electrode GE1 and a second insulating part 11-C disposed between the first conductive layer (e.g. the first electrode CE1) and the second conductive layer (e.g. the second electrode CE2) in the capacitor region RCst.

The thickness D2 of the second insulating part 11-C is smaller than the thickness D1 of the first insulating part 11-T. When the first concave region CV1 is formed, since a portion of the first insulating layer 11 is removed, the thickness D2 of at least a portion of the second insulating part 11-C is smaller than the thickness D1 of the first insulating part 11-T.

In view of the above, if the capacitor Cst in the display device according to the present embodiment is made to have a capacitance equal to a capacitance of a conventional display device, the area of the capacitor region RCst according to the present embodiment can be reduced. Thus, an area of a light emitting region REL described later is relatively increased and aperture ratio is increased.

As illustrated in FIGS. 2 and 3B, a second gate electrode GE2 of the driving transistor TR2 is a structure protruded from the first electrode CE1 of the capacitor Cst.

A second semiconductor layer AL2, a second source electrode SE2, and a second drain electrode DE2 are disposed on the second gate electrode GE2 with the first insulating layer 11 therebetween.

The second source electrode SE2 branches off from the driving line KL4. At least a portion of the second source electrode SE2 is overlapped with the second semiconductor layer AL2. As illustrated in FIG. 3B, a portion of the second source electrode SE2 may be disposed on the second semiconductor layer AL2 and a remaining portion (e.g., the rest) of the second source electrode SE2 may be disposed on the first insulating layer 11.

The second drain electrode DE2 is spaced apart from the second source electrode SE2. At least a portion of the second drain electrode DE2 is overlapped with the second semiconductor layer AL2.

A second insulating layer 12 is disposed on the first insulating layer 11. The second insulating layer 12 covers the second semiconductor layer AL2, the second source electrode SE2, and the second drain electrode DE2.

The organic light emitting element EL electrically connected to the driving transistor TR2 is disposed on the second insulating layer 12. The organic light emitting element EL includes a first electrode PE1, an organic light emitting layer OE, and a second electrode PE2. The first electrode PE1 of the organic light emitting element EL is connected to the second drain electrode DE2 through a second contact hole TH2.

The first electrode PE1 is disposed on the second insulating layer 12, and a third insulating layer 13 covering the first electrode PE1 is disposed on the second insulating layer 12. The third insulating layer 13 has an opening OP exposing a portion of the first electrode PE1. The organic light emitting layer OE is disposed on an inner surface of the opening OP. The organic light emitting layer OE is in contact with the first electrode PE1. The second electrode PE2 is in contact with the organic light emitting layer OE and a portion of the second electrode PE2 is disposed on a top surface of the third insulating layer 13. In addition, a sealing member may be disposed on the second electrode PE2. The sealing member may be a metal substrate. Alternatively, the sealing member may include at least one of an organic layer and an inorganic layer.

As illustrated in FIG. 3B, the substrate 10 includes a second transistor region RTR2 and a light emitting region REL. The second transistor region RTR2 is a region in which the driving transistor TR2 is formed, and the light emitting region REL is a region in which the organic light emitting element EL is formed.

The second gate electrode GE2, which corresponds to a portion of the first conductive layer, is disposed in the second transistor region RTR2. Additionally, the second source electrode SE2 and the second drain electrode DE2, which correspond to portions of the second conductive layer, are disposed in the second transistor region RTR2. Furthermore, the second semiconductor layer AL2 is disposed in the second transistor region RTR2.

The first electrode PE1, the organic light emitting layer OE, and the second electrode PE2 are disposed in the light emitting region REL.

The first insulating layer 11 includes a third insulating part 11-T" disposed between the second semiconductor layer AL2 and the second gate electrode GE2. A thickness D1" of the third insulating part 11-T" may be substantially equal to the thickness D1 of the first insulating part 11-T.

FIGS. 4 to 11 are cross-sectional views illustrating portions of pixels according to other embodiments of the present invention. Hereinafter, display devices according to other embodiments of the present invention will be described with reference to FIGS. 4 to 11. The same elements as described with reference to FIGS. 1 to 3B will be indicated by the same reference numerals or the same reference designators. Descriptions to the same elements as described with reference to FIGS. 1 to 3B will be omitted or mentioned briefly.

Figure 4:
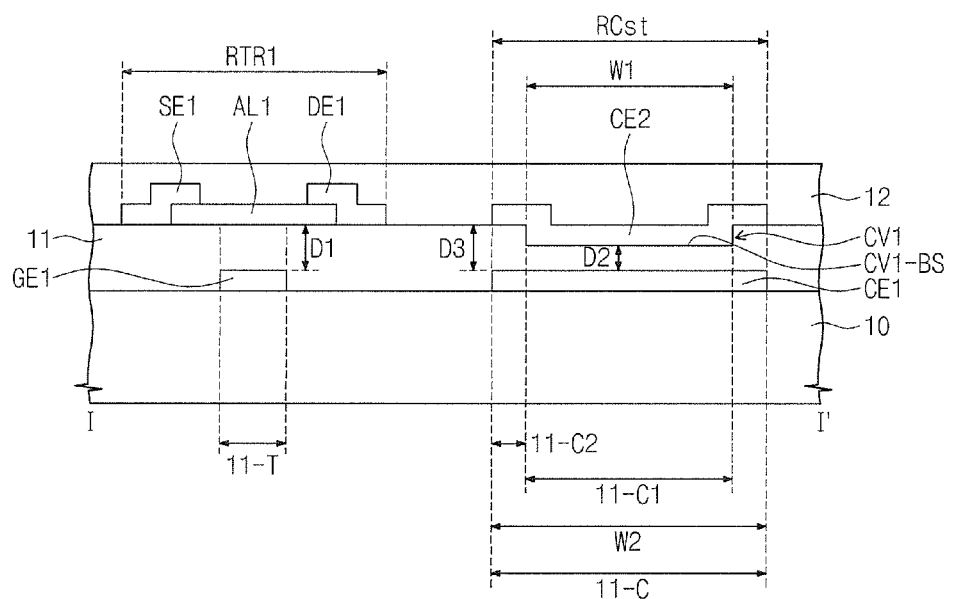
FIGS. 4 to 13 are cross-sectional views illustrating portions of pixels according to embodiments of the present invention.

In a pixel illustrated in FIG. 4, the width W1 of the first concave region CV1 is smaller (less) than a width W2 of the first electrode CE1. The widths W1 and W2 are measured in the second direction which is an extending direction of the data line. Even though not shown in the drawings, a width of the first concave region CV1 in the first direction is also smaller than a width of the first electrode CE1 in the first direction.

At least a portion of the second electrode CE2 is disposed in the first concave region CV1. The second electrode CE2 may have a width equal to the width W2 of the first electrode CE1. A center portion of the second electrode CE2 is in contact with a bottom surface CV1-BS of the first concave region CV1, and an external (higher) portion of the second electrode CE2 is in contact with the top surface of the first insulating layer 11. However, the width of the second electrode CE2 may be suitably changed.

The second insulating part 11-C has various thicknesses that are different from each other according to positions thereof. For example, the second insulating part 11-C includes a portion 11-C1 having the thickness D2 smaller than the thickness D1 of the first insulating part 11-T, and a portion 11-C2 having a thickness D3 substantially equal to the thickness D1 of the first insulating part 11-T.

The portion 11-C1 (hereinafter, referred to as 'an internal portion') having the thickness D2 smaller than the thickness D1 of the first insulating part 11-T may be surrounded by the portion 11-C2 (hereinafter, referred to as 'an external portion') having the thickness D3 substantially equal to the thickness D1 of the first insulating part 11-T when viewed from a plan view.

The center portion of the second electrode CE2 is disposed to correspond to the internal portion 11-C1 of the second insulating part 11-C, and the external portion of the second electrode CE2 is disposed to correspond to the external portion 11-C2 of the second insulating part 11-C.

In a display device, a thickness of a conductive layer increases to reduce a resistance of the conductive layer for decreasing a voltage drop phenomenon according to a resistance (IR drop). As the thickness of the conductive layer increases, a leakage current increases. The leakage current is mainly generated at an edge of the electrode or the signal line.

Since the external portion 11-C2 of the second insulating part 11-C has the thickness greater than that of the internal portion 11-C1 in the capacitor Cst illustrated in FIG. 4, a distance between the edge of the first electrode CE1 and the edge of the second electrode CE2 is greater than a distance between the center portion of the first electrode CE1 and the center portion of the second electrode CE2. Thus, the leakage current of the capacitor Cst may be reduced. Additionally, a voltage breakdown generated at the edge of the first electrode CE1 decreases.

Figure 5A:
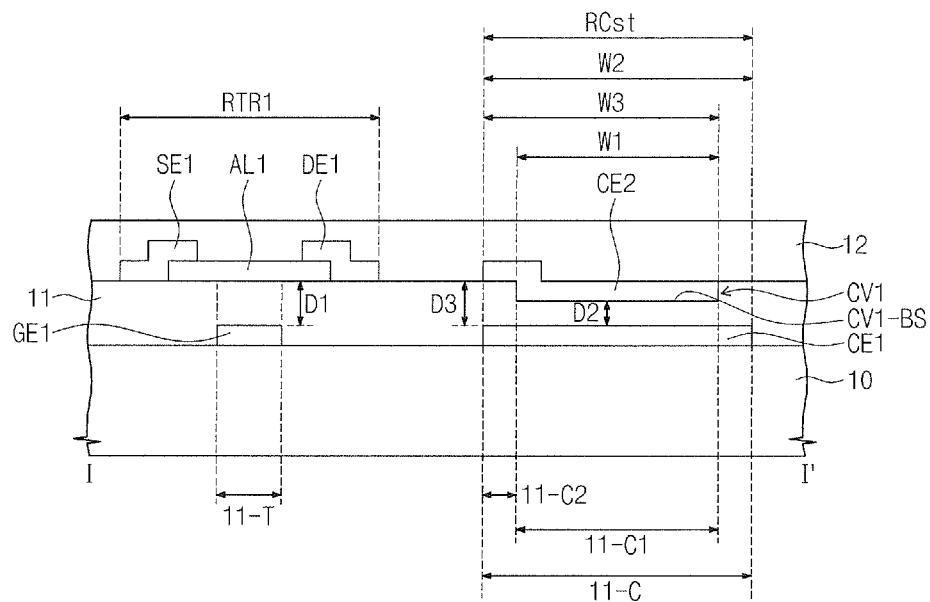

In a pixel illustrated in FIG. 5A, a width W3 of the second electrode CE2 is smaller than a width W2 of the first electrode CE1. The width W1 of the first concave region CV1 is smaller than the width W2 of the first electrode CE1.

At least a portion of the second electrode CE2 is disposed in the first concave region CV1. A portion of the second electrode CE2 is in contact with an entire bottom surface CV1-BS of the first concave region CV1.

As illustrated in FIG. 5A, a first sidewall of the second electrode CE2 is disposed on the top surface of the insulating layer 11, and a second sidewall of the second electrode CE2 is disposed on the bottom surface CV1-BS of the first concave region CV1. The second sidewall of the second electrode CE2 may be in contact with an inner sidewall of the first concave region CV1. In other embodiments, the first sidewall of the second electrode CE2 may also be disposed on the bottom surface CV1-BS of the first concave region CV1.

A first side edge of the first electrode CE1 is aligned (flush) with a first side edge of the second electrode CE2, but a second side edge of the first electrode CE1 is not aligned with a second side edge of the second electrode CE2. Since the second side edge of the first electrode CE1 is not aligned with the second side edge of the second electrode CE2, even though a current is concentrated at the second side edge of the first electrode CE1, the voltage breakdown generated at the second side edge of the first electrode CE1 is reduced.

Figure 5B:
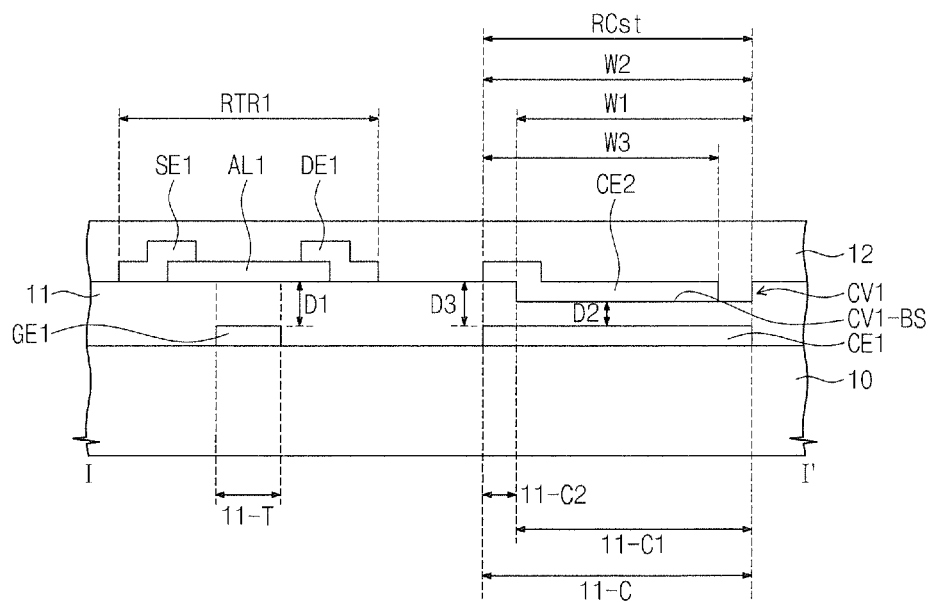

In a pixel illustrated in FIG. 5B, a width W3 of the second electrode CE2 is smaller (less) than a width W2 of the first electrode CE1. In FIG. 5B, a width W1 of the first concave region CV1 is smaller than the width W2 of the first electrode CE1. However, the present invention is not limited thereto. In other embodiments, the first concave region CV1 may have a width greater than the width W2 of the first electrode CE1.

At least a portion of the second electrode CE2 is disposed in the first concave region CV1. A portion of the second electrode CE2 is disposed on a portion of the bottom surface CV1-BS of the first concave region CV1. A portion of the second insulating layer 12 is disposed on a remaining portion (e.g., the rest) of the bottom surface CV1-BS of the first concave region CV1.

As illustrated in FIG. 5B, a first sidewall of the second electrode CE2 is disposed on the top surface of the first insulating layer 11 and a second sidewall of the second electrode CE2 is disposed on the bottom surface CV1-BS of the first concave region CV1. Here, the second sidewall of the second CE2 is laterally spaced apart from the inner sidewall of the first concave region CV1.

A first side edge of the first electrode CE1 is disposed to correspond to the external portion 11-C2 of the second insulating part 11-C, and a second side edge of the first electrode CE1 is disposed to correspond to (flush with) the internal portion 11-C1.

Since the second side edge of the first electrode CE1 is not aligned (flush) with a second side edge of the second electrode CE2, even though a current is concentrated at the another side edge of the first electrode CE1, a voltage breakdown generated at the another side edge of the first electrode CE1 is reduced.

Figure 6:
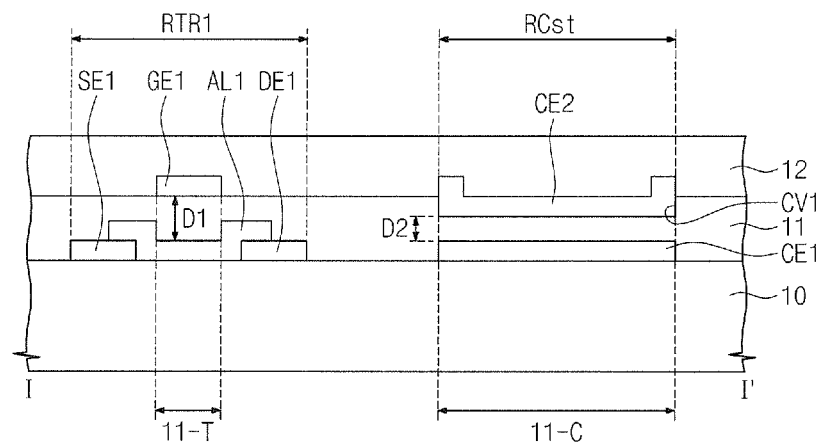

In a pixel illustrated in FIG. 6, the first gate electrode GE1 of the switching transistor TR1 is disposed on the first semiconductor layer AL1, the first source electrode SE1, and the first drain electrode DE1 with the insulating layer 11 therebetween. Differently from the inverted staggered structure illustrated in FIG. 3A, the switching transistor TR1 according to the present embodiment, has a staggered structure.

Each of the first source electrode SE1 and the first drain electrode DE1 are spaced apart from each other on the substrate 10. The first semiconductor layer AL1 is disposed on a surface of the substrate 10 between the first source electrode SE1 and the first drain electrode DE1. Portions of the first semiconductor layer AL1 are overlapped with the first source electrode SE1 and the first drain electrode DE1, respectively. The portions of the first semiconductor layer AL1 are disposed on a surface of the first source electrode SE1 and a surface of the first drain electrode DE1, respectively.

Figure 7:
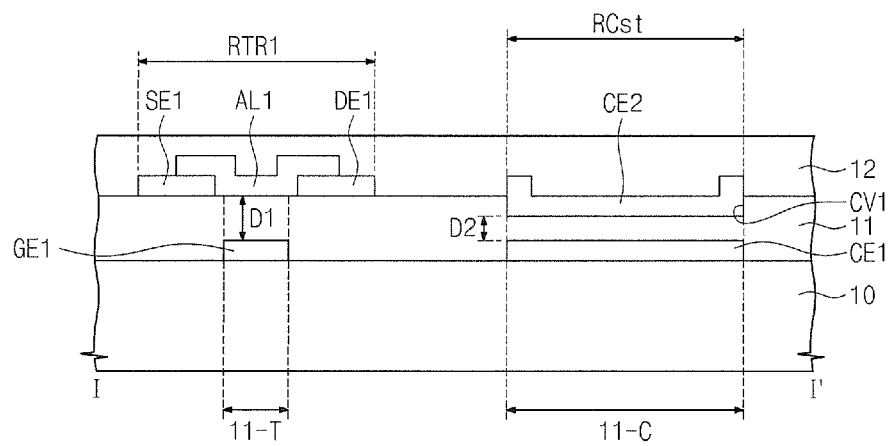

In a pixel illustrated in FIG. 7, the switching transistor TR1 has an inverted co-planar structure.

The first gate electrode GE1 of the switching transistor TR1 is disposed on the substrate 10. The first semiconductor layer AL1, the first source electrode SE1, and the first drain electrode DE1 are disposed on a surface of the first insulating layer 11. The first source electrode SE1 and the first drain electrode DE1 are spaced apart from each other on the first insulating layer 11.

The first semiconductor layer AL1 is disposed on the surface of the first insulating layer 11 between the first source electrode SE1 and the first drain electrode DE1. Portions of the first semiconductor layer AL1 are overlapped with the first source electrode SE1 and the first drain electrode DE1, respectively. The portions of the first semiconductor layer AL1 are disposed on a surface of the first source electrode SE1 and a surface of the first drain electrode DE1, respectively.

Figure 8:
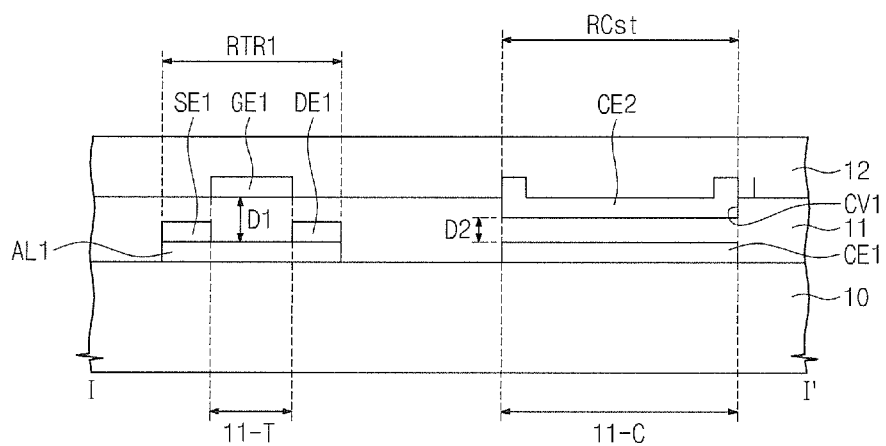

In a pixel illustrated in FIG. 8, the switching transistor TR1 has a co-planar structure.

The first semiconductor layer AL1 of the switching transistor TR1 is disposed on a surface of the substrate 10. The first source electrode SE1 and the first drain electrode DE1 are spaced apart from each other on the first semiconductor layer AL1. The first gate electrode GE1 of the switching transistor TR1 is disposed on the first semiconductor layer AL1 with the first insulating layer 11 therebetween.

Here, the capacitors Cst of the pixels illustrated in FIGS. 6 to 8 have the same structure as the capacitor Cst illustrated in FIG. 3A. In other words, the widths of the first electrode CE1, the second electrode CE2, and the first concave region CV1 are equal to each other. However, the present invention is not limited thereto. The structures of the capacitors Cst illustrated in FIGS. 6 to 8 may be modified as the capacitors Cst illustrated in FIGS. 4, 5A, and 5B.

Additionally, a structure of the driving transistor TR2 may also be suitably modified as the staggered structure, the inverted co-planar structure, or the co-planar structure.

Figure 9:
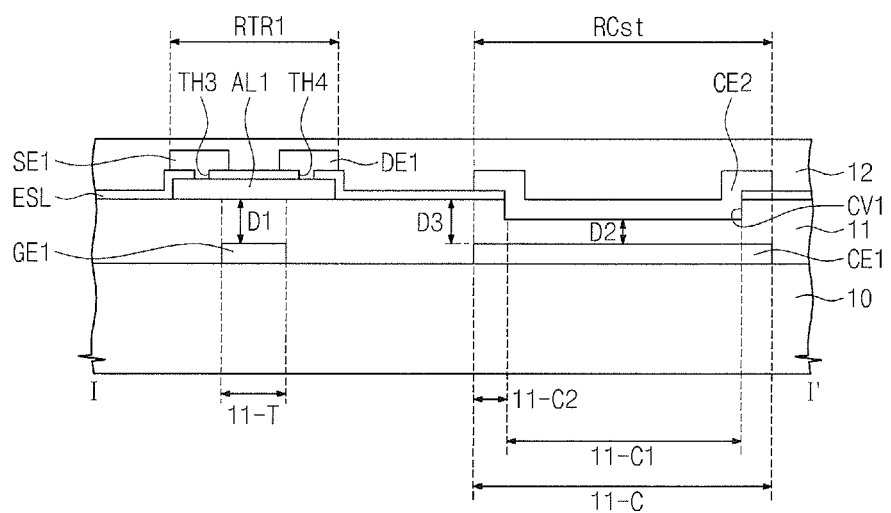

In a pixel illustrated in FIG. 9, a protection layer ESL is disposed on the substrate 10. The protection layer ESL is disposed between the first semiconductor layer AL1 and the first source electrode SE1, and between the first semiconductor layer AL1 and the first drain electrode DE1.

The protection layer ESL may be an etch stop layer preventing an over-etching of the first semiconductor layer AL1. The protection layer ESL is formed on the first insulating layer so as to cover the first semiconductor layer AL1. The first source electrode SE1 is connected to the first semiconductor layer AL1 through a third contact hole TH3 penetrating the protection layer ESL. The first drain electrode DE1 is connected to the first semiconductor layer AL1 through a fourth contact hole TH4 penetrating the protection layer ESL.

Additionally, the first concave region CV1 penetrates the protection layer ESL. Thus, even though the display device according to the present invention further includes the protection layer ESL, the distance D2 between the first and second electrodes CE1 and CE2 in a portion of the capacitor region Cst is shorter (less) than the distance D1 between the first gate electrode GE1 and the first semiconductor layer AL1. In other words, the thickness D2 of at least a portion of the second insulating part 11-C is smaller (less) than the thickness D1 of the first insulating part 11-T.

Figure 10:
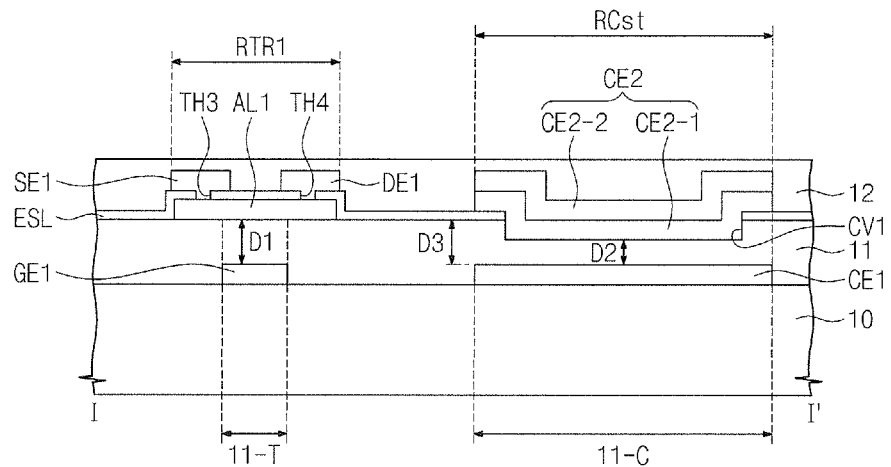

In a pixel illustrated in FIG. 10, the second electrode CE2 has a two-layered structure. The second electrode CE2 includes a first electrode layer CE2-1 and a second electrode layer CE2-2. The first electrode layer CE2-1 is formed of the same material as the first semiconductor layer AL1. The second electrode layer CE2-2 is disposed on the first electrode layer CE2-1 and is formed of the same material as the first source electrode SE1.

At least a portion of the first electrode layer CE2-1 is disposed in the first concave region CV1, and at least a portion of the second electrode layer CE2-2 is disposed to correspond to the first concave region CV1. Widths of the first electrode layer CE2-1 and the second electrode layer CE2-2 may be equal to each other.

Figure 11:
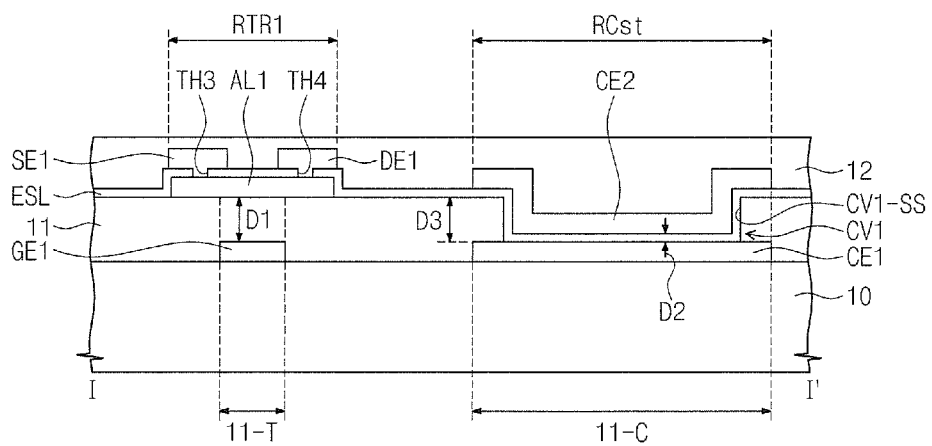

In a pixel illustrated in FIG. 11, the first concave region CV1 exposes at least a portion of the first electrode CE1. In other words, the first concave region CV1 penetrates through a portion of the first insulating layer 11.

Here, a portion of the protection layer ESL is disposed on an inner sidewall CV1-SS of the first concave region CV1 and the first electrode CE1. The second electrode CE2 is disposed in the first concave region CV1 and on the protection layer ESL. The portion of the protection layer ESL, that is disposed between the first and second electrodes CE1 and CE2, functions as the second insulating part 11-C (i.e. the dielectric of the capacitor).

Here, the capacitors Cst illustrated in FIGS. 9 to 11 have the same structure as the capacitor Cst illustrated in FIG. 4. However, the present invention is not limited thereto. The capacitors Cst illustrated in FIGS. 9 to 11 may be suitably modified as the capacitors Cst illustrated in FIGS. 3A, 5A, and 5B.

Figure 12:
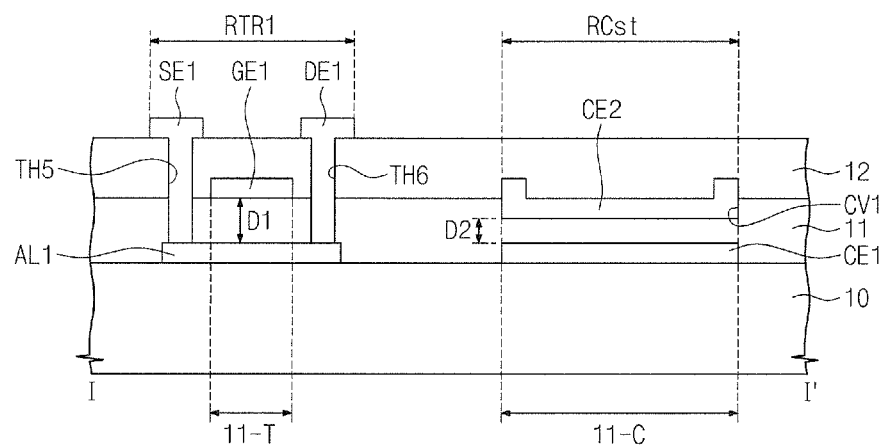
Figure 13:
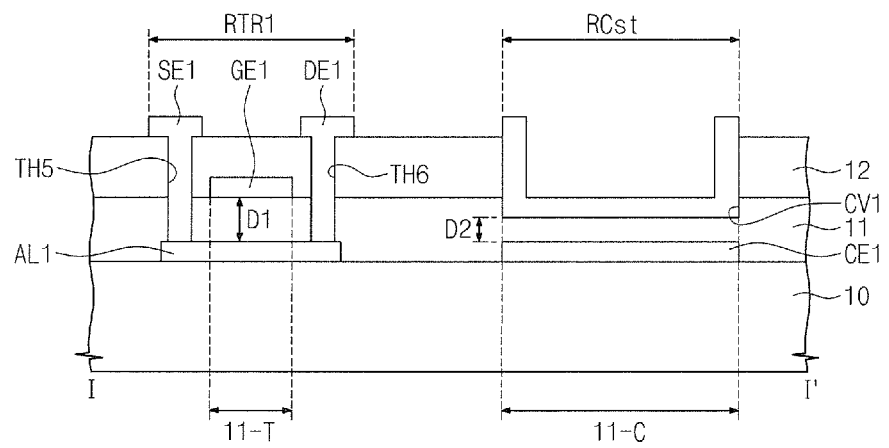

FIGS. 12 and 13 are cross-sectional views illustrating portions of pixels according to other embodiments of the present invention. Hereinafter, display devices according to the other embodiments of the present invention will be described with reference to FIGS. 12 and 13. The same elements as described with reference to FIGS. 1 to 11 will be indicated by the same reference numerals or the same reference designators. Thus, descriptions to the same elements as described with reference to FIGS. 1 to 11 will be omitted or mentioned briefly.

As illustrated in FIGS. 12 and 13, the first source electrode SE1 and the first drain electrode DE1 of the switching transistor TR1 are disposed on a layer different from a layer on which the first semiconductor layer AL1 is disposed.

In a pixel illustrated in FIG. 12, the first semiconductor layer AL1 is disposed on one surface of the substrate 10. Additionally, the first electrode CE1 of the capacitor Cst is disposed on the one surface of the substrate 10. The first insulating layer 11 is disposed on the substrate 10, so that the first insulating layer 11 covers the first semiconductor layer AL1 and the first electrode SE1.

Here, the first electrode CE1 may be formed of the same material as the first semiconductor layer AL1. Thus, the first electrode CE1 and the first semiconductor AL1 are formed by the same process. As a result, productivity of the display device is improved.

The first gate electrode GE1 and the second electrode CE2 of the capacitor Cst are disposed on one surface of the first insulating layer 11. The first gate electrode GE1 is overlapped with the first semiconductor layer AL1, and at least a portion of the second electrode CE2 is disposed in the first concave region CV1 formed in the first insulating layer 11. Widths of the first concave region CV1, the first electrode CE1, and the second electrode CE2 may be equal to each other.

A second insulating layer 12 is disposed on the first insulating layer and covers the first gate electrode GE1 and the second electrode CE2.

The first source electrode SE1 and the first drain electrode DE1 are spaced apart from each other on one surface of the second insulating layer 12. The first gate electrode GE1 of the switching transistor TR1 is disposed on the first semiconductor layer ALA with the first insulating layer therebetween.

The first source electrode SE1 is connected to the first semiconductor layer AL1 through a fifth contact hole TH5 penetrating the second insulating layer 12 and the first insulating layer 11. The first drain electrode DE1 is connected to the first semiconductor layer AL1 through a sixth contact hole TH6 penetrating the second insulating layer 12 and the first insulating layer 11.

In a pixel illustrated in FIG. 13, the first semiconductor layer AL1 and the first electrode CE1 of the capacitor Cst is disposed on one surface of the substrate 10. The first insulating layer 11 is disposed on the substrate 10 and covers the first semiconductor layer AL1 and the first electrode SE1.

The first gate electrode GE1 is disposed on one surface of the first insulating layer 11 and is overlapped with the first semiconductor layer AL1. The first insulating layer 11 has a first concave region CV1.

A second insulating layer covering the first gate electrode GE1 is disposed on the first insulating layer 11. The first source electrode SE1 and the first drain electrode DE1 are spaced apart from each other on the second insulating layer 12. The first source electrode SE1 is connected to the first semiconductor layer AL1 through a fifth contact hole TH5 penetrating the second insulating layer 12 and the first insulating layer 11. The first drain electrode DE1 is connected to the first semiconductor layer AL1 through a sixth contact hole TH6 penetrating the second insulating layer 12 and the first insulating layer 11.

The first concave region CV1 penetrates through the second insulating layer 12. At least a portion of the second electrode CE2 is disposed in the first concave region CV1. Widths of the first concave region CV1, the first electrode CE1, and the second electrode CE2 may be equal to each other.

Here, FIGS. 12 and 13 show the pixels including the first concave region CV1, which has the same width as the first electrode CE1, as an example. However, the present invention is not limited thereto. As illustrated in FIGS. 4, 5A, and 5B, the first concave region CV1 may have a width different from a width of the first electrode CE1 in FIGS. 12 and 13.

Figure 14:
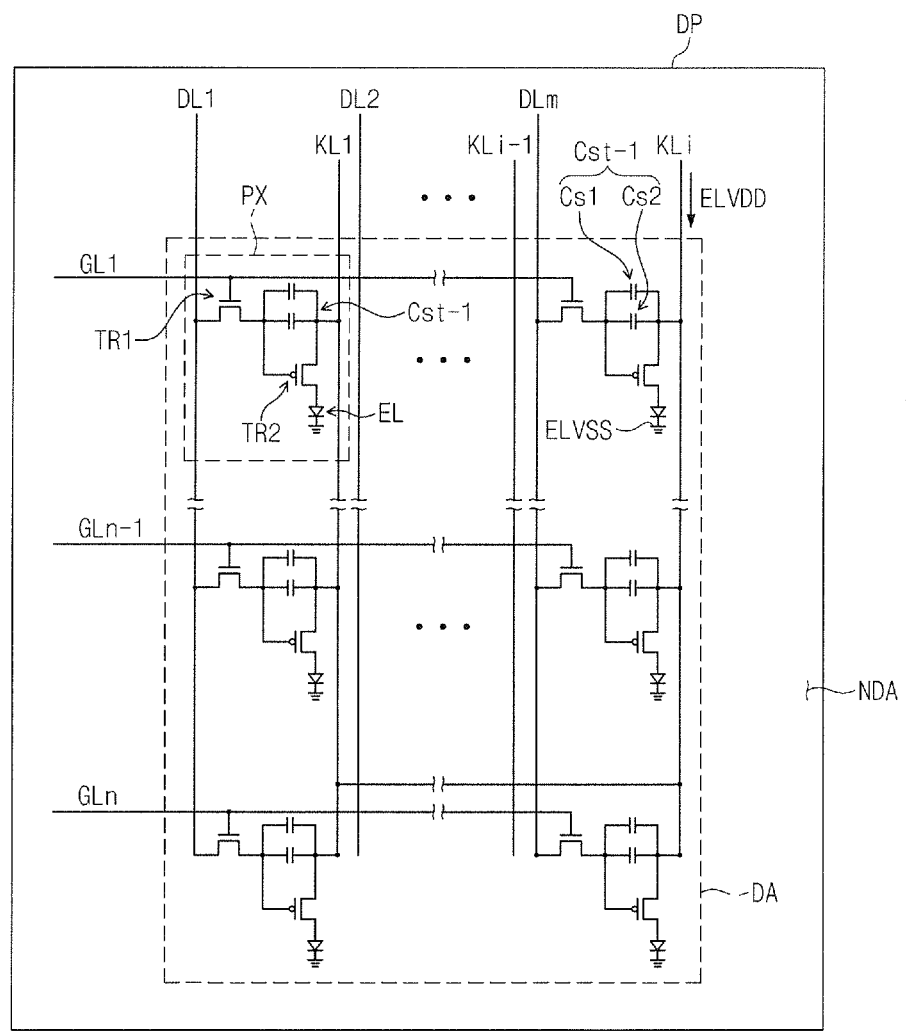
FIG. 14 is a circuit diagram of an organic light emitting display device according to an embodiment of the present invention.
Figure 15:
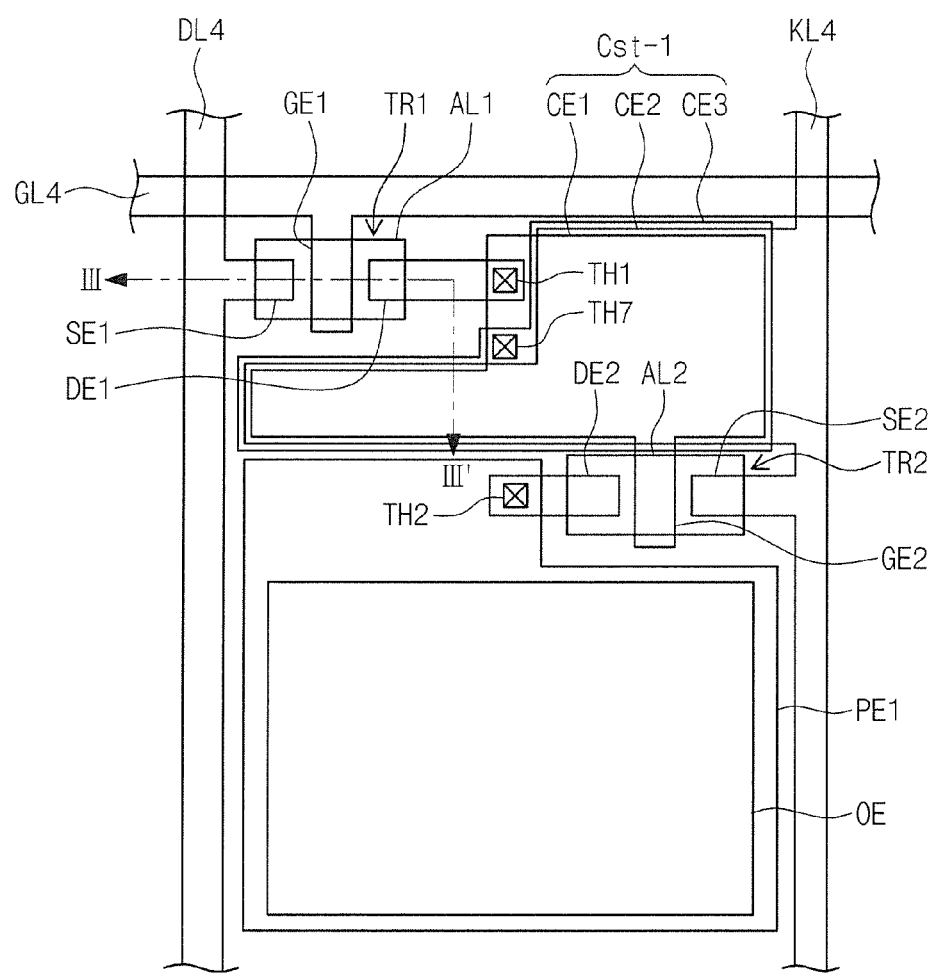
FIG. 15 is a plan view of a pixel illustrated in FIG. 14.
Figure 16:
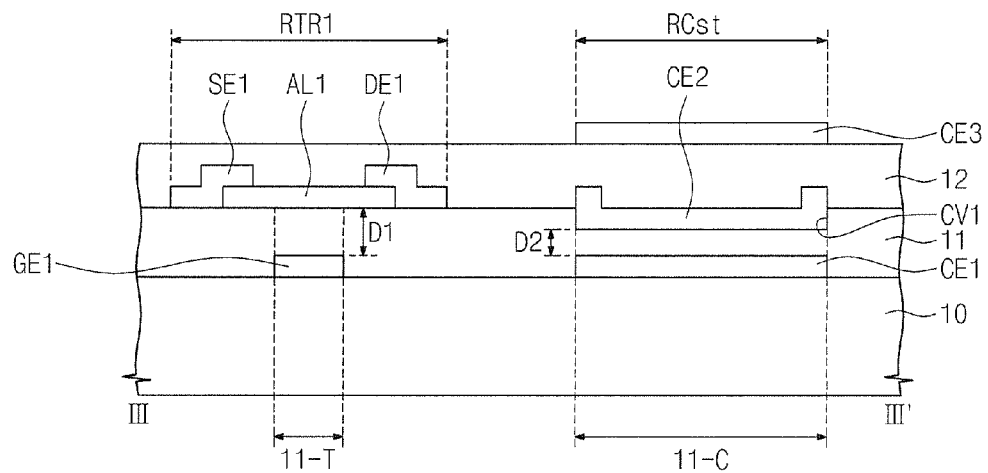
FIG. 16 is a cross-sectional view of a portion of the pixel illustrated in FIG. 15.

FIG. 14 is a circuit diagram of an organic light emitting display device according to another embodiment of the present invention, FIG. 15 is a plan view of a pixel illustrated in FIG. 14, and FIG. 16 is a cross-sectional view of a portion of a pixel illustrated in FIG. 15. Hereinafter, an organic light emitting display device (hereinafter, referred to as 'a display device') according to this embodiment of the present invention, will be described with reference to FIGS. 14 and 16. The same elements as described with reference to FIGS. 1 to 13 will be indicated by the same reference numerals or the same reference designators. Thus, descriptions to the same elements as described with reference to FIGS. 1 to 13 will be omitted or mentioned briefly.

As illustrated in FIG. 14, the pixel PX includes a switching transistor TR1, a driving transistor TR2, a capacitor Cst-1, and an organic light emitting element EL. The capacitor Cst-1 includes a first sub-capacitor Cs1 and a second sub-capacitor Cs2 that are connected in parallel.

As illustrated in FIGS. 15 and 16, the capacitor Cst-1 further includes a third electrode CE3 facing the second electrode CE2.

The first gate electrode GE1 of the switching transistor TR1 and the first electrode CE1 of the capacitor Cst-1 are disposed on the substrate 10. The first insulating layer 11 is disposed on the substrate 10 so as to cover the first gate electrode GE1 and the first electrode CE1.

The first semiconductor layer AL1, the first source electrode SE1, and the first drain electrode DE1 are disposed on one surface of the first insulating layer 11. The first source electrode SE1 and the first drain electrode DE1 are spaced apart from each other on the first insulating layer 11. At least a portion of each of the first source electrode SE1 and the first drain electrode DE1 is overlapped with the first semiconductor layer AL1.

The first insulating layer 11 has the first concave region CV1. At least a portion of the second electrode CE2 is disposed in the first concave region CV1. Widths of the first concave region CV1 and the first electrode CE1 are equal to each other. However, the present invention is not limited thereto. As illustrated in FIG. 3, the widths of the first concave region CV1 and the first electrode CE may be different from each other.

A second insulating layer 12 is disposed on the first insulating layer 11 so as to cover the first semiconductor layer AL1, the first source electrode SE1, the first drain electrode DE1, and the second electrode CE2.

The third electrode CE3 faces the second electrode CE2 with the second insulating layer 12 therebetween. The third electrode CE3 is electrically connected to the first electrode CE1. As illustrated in FIG. 15, the third electrode CE3 is connected to the first electrode CE1 through a seventh contact hole TH7. The seventh contact hole TH7 penetrates the second insulating layer 12 and the first insulating layer 11. A width of the third electrode CE is equal to the width of the second electrode CE2. However, the present invention is not limited thereto.

The first electrode CE1 and the second electrode CE2 constitute two electrodes of the first sub-capacitor Cs1, and the second electrode CE2 and the third electrodes CE3 constitute two electrodes of the second sub-capacitor Cs2. The capacitor Cst-1 includes two sub-capacitors Cs1 and Cs2 connected in parallel to have a large capacitance in a narrow area.

Here, the switching transistor TR1 having the inverted staggered structure is illustrated as an example in FIG. 16. However, the present invention is not limited thereto. The structure of the switching transistor TR1 may be suitably modified as the staggered structure, the inverted co-planar structure, or the co-planar structure.

Figure 17:
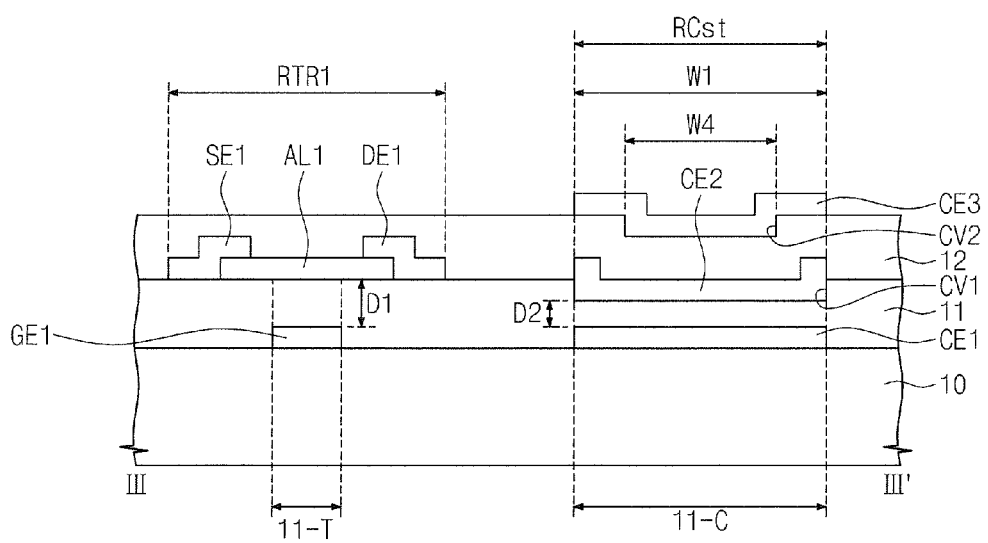
FIGS. 17 to 20 are cross-sectional views illustrating portions of pixels according to embodiments of the present invention.

FIG. 17 is a cross-sectional view illustrating a portion of a pixel according to yet still other embodiments of the present invention. As illustrated in FIG. 17, the second insulating layer 12 includes a second concave region CV2 overlapped with the second electrode CE2. At least a portion of the third electrode CE3 is disposed in the second concave region CV2. Thus, a capacitance of the second sub-capacitor Cs2 increases in the same area.

For reducing the amount of a leakage current, a width W4 of the second concave region CV2 may be smaller than the width W1 of the first concave region CV1. Alternatively, widths of the first, second, and third electrodes CE1, CE2, and CE3 may be different from each other unlike those illustrated in FIG. 17.

Here, FIG. 17 shows the switching transistor TR1 having the inverted staggered structure as an example. Alternatively, the structure of the switching transistors TR1 may be suitably modified as the staggered structure, the inverted co-planar structure, or the co-planar structure.

Figure 18:
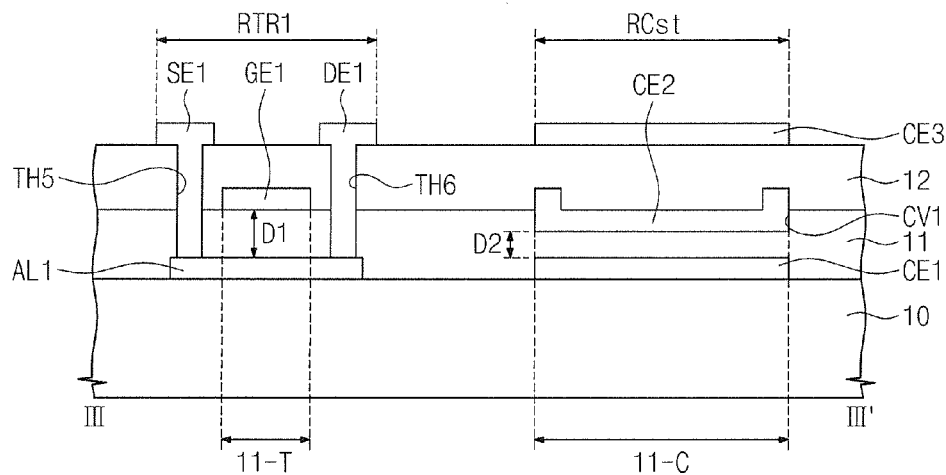
Figure 19:
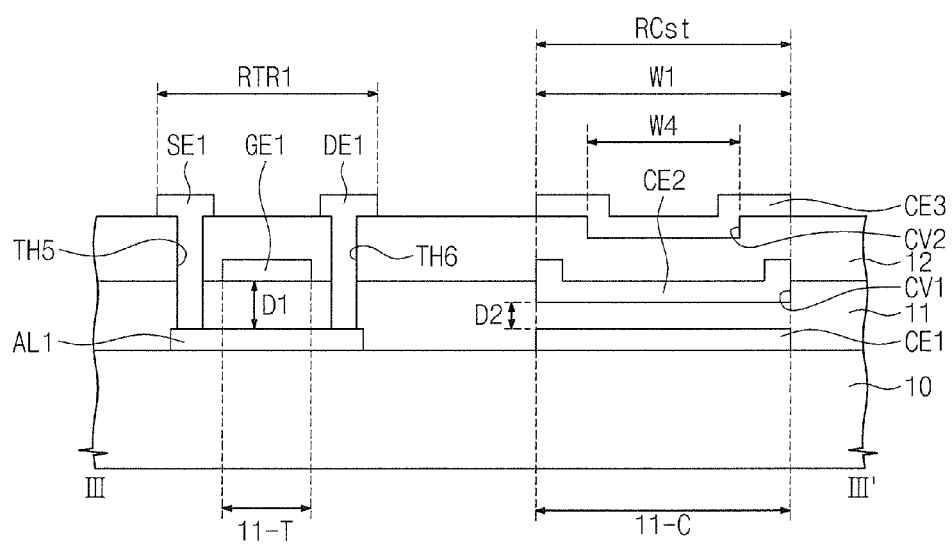

FIGS. 18 and 19 are cross-sectional views illustrating portions of pixels according to yet still other embodiments of the present invention. Hereinafter, display devices according to these yet still other embodiments of the present invention, will be described with reference to FIGS. 18 and 19. The same elements as described with reference to FIGS. 1 to 17 will be indicated by the same reference numerals or the same reference designators. Thus, descriptions to the same elements as described with reference to FIGS. 1 to 17 will be omitted or mentioned briefly.

In the display devices illustrated in FIGS. 18 and 19, the first source electrode SE1 and the first drain electrode DE1 of the switching transistor TR1 are disposed on a layer different from the layer on which the first semiconductor layer AL1 as illustrated in FIGS. 12 and 13.

As illustrated in FIGS. 18 and 19, the first semiconductor layer AL1 and the first electrode CE1 of the capacitor Cst-1 are disposed on one surface of the substrate 10. The first insulating layer 11 is disposed on the substrate 10 so as to cover the first semiconductor layer AL1 and the first electrode SE1. The first electrode CE1 may be formed of the same material as the first semiconductor layer AL1.

The first insulating layer 11 has the first concave region CV1 corresponding to the first electrode CE1. The first gate electrode GE1 and the second electrode CE2 are disposed on one surface of the first insulating layer 11. At least a portion of the second electrode CE2 is disposed in the first concave region CV1.

The second insulating layer 12 is disposed on the first insulating layer 11 so as to cover the first gate electrode GE1 and the second electrode CE2.

The first source electrode SE1 and the first drain electrode DE1 are spaced apart from each other on one surface of the second insulating layer 12.

The first source electrode SE1 is connected to the first semiconductor layer AL1 through the fifth contact hole TH5 penetrating the second insulating layer 12 and the first insulating layer 11. The first drain electrode DE1 is connected to the first semiconductor layer AL1 through the sixth contact hole TH6 penetrating the second insulating layer 12 and the first insulating layer 11.

As illustrated in FIG. 18, the third electrode CE3 faces the second electrode CE2 with the second insulating layer 12 therebetween. The third electrode CE3 is electrically connected to the first electrode CE1.

The first electrode CE1 and the second electrode CE2 constitute two electrodes of the first sub-capacitor Cs1, and the second electrode CE2 and the third electrodes CE3 constitute two electrodes of the second sub-capacitor Cs2.

As illustrated in FIG. 19, the second insulating layer 12 includes the second concave region CV2 overlapped with the second electrode CE2. At least a portion of the third electrode CE3 is disposed in the second concave region CV2. Thus, the capacitance of the second sub-capacitor Cs2 increases in the same area.

For reducing the amount of a leakage current, the width W4 of the second concave region CV2 may be smaller than the width W1 of the first concave region CV1. Alternatively, widths of the first, second, and third electrodes CE1, CE2, and CE3 may be different from each other unlike those illustrated in FIG. 19.

Figure 20:
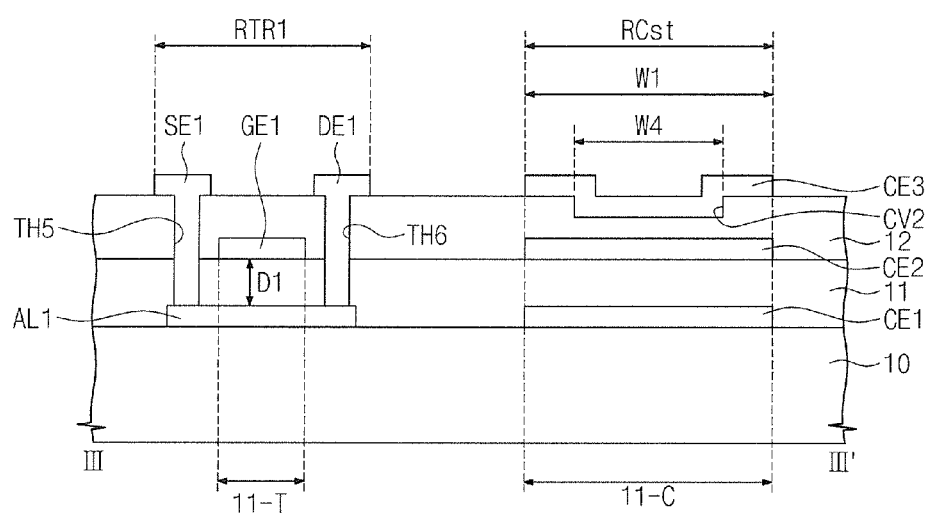

FIG. 20 is a cross-sectional view illustrating a portion of a pixel according to another embodiment of the present invention. Hereinafter, the display device according to this embodiment of the present invention will be described with reference to FIG. 20. The same elements as described with reference to FIGS. 1 to 19 will be indicated by the same reference numerals or the same reference designators. Thus, descriptions to the same elements as described with reference to FIGS. 1 to 19 will be omitted or mentioned briefly.

In the display device illustrated in FIG. 20, the first insulating layer 11 does not have the first concave region, unlike the pixel illustrated in FIG. 19. However, the second insulating layer 12 has the second concave region CV2.

The third electrode CE3 faces the second electrode CE2 with the second insulating layer 12 therebetween. At least a portion of the third electrode CE3 is disposed in the second concave region CV2. The third electrode CE3 is electrically connected to the first electrode CE1.

The first electrode CE1 and the second electrode CE2 constitute two electrodes of the first sub-capacitor Cs1, and the second electrode CE2 and the third electrodes CE3 constitute two electrodes of the second sub-capacitor Cs2. Since the second insulating layer 12 has the second concave region CV2, the capacitance of the second sub-capacitor Cs2 increases in the same area.

For reducing the amount of a leakage current, the width W4 of the second concave region CV2 may be smaller than the width W1 of the first concave region CV1. Alternatively, widths of the first, second, and third electrodes CE1, CE2, and CE3 may be different from each other, unlike those illustrated in FIG. 20.

As described above, an organic light emitting display device according to an embodiment includes a capacitor occupying a small area in the pixel of the display device and having the desired capacitance. Thus, aperture ratio of the pixel increases.

In one embodiment, since a first insulating layer has a first concave region and at least a portion of a second electrode is disposed in the first concave region, the capacitor can have a large capacitance in a narrow area.

Additionally, in one embodiment, the thickness of the insulating layer corresponding to the dielectric of the capacitor varies according to a position thereof. Thus, it is possible to reduce the leakage current. Particularly, since the external part of the insulating layer is thicker than the internal part of the insulating layer, the amount of the leakage current is reduced.

Also, in one embodiment, the capacitor may include a first sub-capacitor and a second sub-capacitor connected in parallel. Thus, the capacitance of the capacitor further increases.

While the present invention has been described with reference to example embodiments, it will be apparent to those skilled in the art that various changes and modifications may be made without departing from the spirit and scope of the present invention. Therefore, it should be understood that the above embodiments are not limiting, but illustrative. Thus, the scope of the present invention is to be determined by the broadest permissible interpretation of the following claims and their equivalents, and shall not be restricted or limited by the foregoing description.

What is claimed is:

1. An organic light emitting display device comprising:
a substrate with at least one pixel; and
at least one driving line for providing a driving voltage to the at least one pixel,
wherein the at least one pixel comprises:
a switching transistor comprising a first structure and a second structure on the first structure with a first insulating layer therebetween, the switching transistor being for outputting a data signal in response to a gate signal;
a capacitor comprising a first electrode connected to the switching transistor and a second electrode on the first electrode with the first insulating layer therebetween, the second electrode connected to the driving line;
a driving transistor connected to the second electrode and the driving line; and
an organic light emitting element connected to the driving transistor,
wherein a distance between the first electrode and the second electrode in at least a region, is less than a distance between the first structure and the second structure,
wherein the first structure is disposed under the first insulating layer and the second structure is disposed on the first insulating layer,
wherein the first electrode is disposed under the first insulating layer and the second electrode is disposed on the first insulating layer,
wherein the first insulating layer has a first concave region corresponding to a region in which the first electrode is disposed when viewed from a plan view, and
wherein at least a portion of the second electrode is disposed in the first concave region.

2. The organic light emitting display device of claim 1, wherein a width of the first concave region is less than a width of the first electrode.

3. The organic light emitting display device of claim 2, wherein a width of the second electrode is substantially equal to the width of the first electrode.

4. The organic light emitting display device of claim 1, further comprising:
a second insulating layer covering the second structure and the second electrode.

5. The organic light emitting display device of claim 4, wherein the capacitor further comprises a third electrode facing the second electrode with the second insulating layer therebetween, and the third electrode is electrically connected to the first electrode.

6. The organic light emitting display device of claim 5, wherein the second insulating layer has a second concave region corresponding to a region in which the second electrode is formed when viewed from a plan view; and
wherein at least a portion of the third electrode is disposed in the second concave region.

7. The organic light emitting display device of claim 1, wherein the first structure is a gate electrode;
wherein the second structure comprises a semiconductor layer, a source electrode of which at least a portion is overlapped with the semiconductor layer, and a drain electrode of which at least a portion is overlapped with the semiconductor layer; and
wherein the drain electrode is spaced apart from the source electrode.

8. The organic light emitting display device of claim 7, further comprising:
a protection layer of which at least a portion is disposed on the first insulating layer,
wherein the protection layer is disposed between the semiconductor layer and the source electrode, and between the semiconductor layer and the drain electrode; and
wherein each of the source electrode and the drain electrode is connected to the semiconductor layer through a contact hole penetrating the protection layer.

9. The organic light emitting display device of claim 8, wherein the concave region exposes at least a portion of the first electrode;
wherein the protection layer is further disposed on the exposed portion of the first electrode; and
wherein at least a portion of the second electrode is disposed on the protection layer at a position of protection layer which is disposed on the exposed portion of the first electrode.

10. The organic light emitting display device of claim 8, wherein the second electrode comprises:
a first electrode layer of which at least a portion is in contact with an inner surface of the concave region; and
a second electrode layer disposed on the first electrode layer.

11. The organic light emitting display device of claim 10, wherein the first electrode layer is formed of the same material as the semiconductor layer, and the second electrode layer is formed of the same material as the source electrode.

12. An organic light emitting display device comprising:
a substrate with at least one pixel; and
at least one driving line for providing a driving voltage to the at least one pixel,
wherein the at least one pixel comprises:
a switching transistor comprising a semiconductor layer on a surface of the substrate, a gate electrode overlapped with the semiconductor layer with a first insulating layer therebetween, a source electrode connected to the semiconductor layer and disposed on the gate electrode with a second insulating layer therebetween, and a drain electrode connected to the semiconductor layer and spaced apart from the source electrode on the second insulating layer, the switching transistor being for outputting a data signal in response to a gate signal;

a capacitor comprising a first electrode connected to the drain electrode and a second electrode disposed on the first electrode with the first insulating layer therebetween, the second electrode connected to the driving line;
a driving transistor connected to the capacitor and the driving line; and
an organic light emitting element connected to the driving transistor,
wherein a distance between the first electrode and the second electrode in at least a region, is less than a distance between the semiconductor layer and the gate electrode,
wherein the first insulating layer has a concave region corresponding to a region in which the first electrode is formed when viewed from a plan view, and
wherein at least a portion of the second electrode is disposed in the concave region.

13. The organic light emitting display device of claim 12, wherein the semiconductor layer is formed of the same material as the first electrode; and
wherein the gate electrode is formed of the same material as the second electrode.

14. The organic light emitting display device of claim 13, wherein the semiconductor layer and the first electrode are disposed on the same plane.

15. The organic light emitting display device of claim 13, wherein the second insulating layer covers the second electrode.

16. The organic light emitting display device of claim 15, wherein the capacitor further comprises a third electrode facing the second electrode with the second insulating layer therebetween, and the third electrode is electrically connected to the first electrode.

17. The organic light emitting display device of claim 12, wherein a width of the concave region is less than a width of the first electrode.

18. The organic light emitting display device of claim 17, wherein a width of the second electrode is substantially equal to the width of the first electrode.

19. An organic light emitting display device comprising:
a substrate with at least one pixel; and
at least one driving line for providing a driving voltage to the at least one pixel,
wherein the at least one pixel comprises:
a switching transistor comprising a semiconductor layer on a surface of the substrate, a gate electrode overlapped with the semiconductor layer with a first insulating layer therebetween, a source electrode connected to the semiconductor layer and on the gate electrode with a second insulating layer therebetween, and a drain electrode connected to the semiconductor layer and spaced apart from the source electrode on the second insulating layer, the switching transistor being for outputting a data signal in response to a gate signal;
a capacitor comprising a first electrode connected to the drain electrode, a second electrode on the first electrode with the first insulating layer therebetween and connected to the driving line, and a third electrode facing the second electrode with the second insulating layer therebetween and electrically connected to the first electrode;
a driving transistor connected to the capacitor and the driving line; and
an organic light emitting element connected to the driving transistor,
wherein the second insulating layer has a concave region corresponding to a region in which the second electrode is formed when viewed from a plan view; and
wherein at least a portion of the third electrode is disposed in the concave region.

20. The organic light emitting display device of claim 19, wherein a width of the concave region is less than a width of the second electrode.

21. The organic light emitting display device of claim 20, wherein a width of the third electrode is substantially equal to the width of the second electrode.

22. The organic light emitting display device of claim 21, wherein a distance between the first electrode and the second electrode is substantially equal to a distance between the semiconductor layer and the gate electrode.

23. An organic light emitting display device comprising:
a substrate having a transistor region and a capacitor region;
a first conductive layer, a first insulating layer, and a second conductive layer sequentially stacked on the substrate; and
a semiconductor layer in the transistor region,
wherein the first insulating layer comprises:
a first insulating part between the semiconductor layer and the first conductive layer of the transistor region, or between the semiconductor layer and the second conductive layer of the transistor region; and
a second insulating part between the first conductive layer of the capacitor region and the second conductive layer of the capacitor region,
wherein a thickness of at least a portion of the second insulating part is less than a thickness of the first insulating part,
wherein the first insulating layer has a concave region corresponding to a region in which the first conductive layer is disposed when viewed from a plan view, and
wherein at least a portion of the second conductive layer is disposed in the concave region.

24. The organic light emitting display device of claim 23, wherein one of the first conductive layer in the transistor region and the second conductive layer in the transistor region comprises a source electrode part and a drain electrode part respectively overlapped with portions of the semiconductor layer; and
wherein another one of the first conductive layer in the transistor region and the second conductive layer in the transistor region comprises a gate electrode part overlapped with the semiconductor layer.

25. The organic light emitting display device of claim 23, wherein the second insulating part comprises an internal part and an external part surrounding the internal part when viewed from a plan view; and
wherein a thickness of the external part is greater than a thickness of the internal part.

26. The organic light emitting display device of claim 23, further comprising:
a second insulating layer stacked on the second conductive layer; and
a third conductive layer disposed on the second insulating layer in the capacitor region and electrically connected to the first conductive layer.

27. An organic light emitting display device comprising:
a substrate having a transistor region and a capacitor region; and
a semiconductor layer, a first insulating layer, a first conductive layer, a second insulating layer, and a second conductive layer sequentially stacked on the substrate, wherein the first insulating layer comprises:
a first insulating part between the semiconductor layer of the transistor region and the first conductive layer of the transistor region; and
a second insulating part between the semiconductor layer of the capacitor region and the first conductive layer of the capacitor region,
wherein a thickness of at least a portion of the second insulating part is less than a thickness of the first insulating part,
wherein the first insulating layer has a concave region corresponding to a region in which the first conductive layer is disposed when viewed from a plan view, and
wherein at least a portion of the second conductive layer is disposed in the concave region.

28. An organic light emitting display device comprising:
a substrate having a transistor region and a capacitor region; and
a semiconductor layer, a first insulating layer, a first conductive layer, a second insulating layer, and a second conductive layer sequentially stacked on the substrate,
wherein the first insulating layer comprises:
a first insulating part between the semiconductor layer of the transistor region and the first conductive layer of the transistor region; and
a second insulating part between the semiconductor layer of the capacitor region and the first conductive layer of the capacitor region,
wherein a thickness of at least a portion of the second insulating part is less than a thickness of the first insulating part,
wherein the second insulating part comprises an internal part and an external part surrounding the internal part when viewed from a plan view, and
wherein a thickness of the external part is greater than a thickness of the internal part.

29. The organic light emitting display device of claim 27, wherein the first conductive layer comprises:
a gate electrode part overlapped with the semiconductor layer of the transistor region; and
a first capacitor electrode part overlapped with the semiconductor layer of the capacitor region.

30. The organic light emitting display device of claim 29, wherein the second conductive layer of the transistor region comprises a source electrode part and a drain electrode part that are connected to the semiconductor layer and are spaced apart from each other.

31. The organic light emitting display device of claim 29, wherein the second conductive layer comprises a second capacitor electrode part connected to the semiconductor layer of the capacitor region and facing the first capacitor electrode part.

* * * * *